United States Patent [19]

Coultas et al.

[11] Patent Number: 5,304,279
[45] Date of Patent: Apr. 19, 1994

[54] RADIO FREQUENCY INDUCTION/MULTIPOLE PLASMA PROCESSING TOOL

[75] Inventors: Dennis K. Coultas, Hopewell Junction; John H. Keller, Poughkeepsie, both of N.Y.

[73] Assignee: International Business Machines Corporation, Armonk, N.Y.

[21] Appl. No.: 951,978

[22] Filed: Sep. 28, 1992

Related U.S. Application Data

[63] Continuation of Ser. No. 565,851, Aug. 10, 1990, abandoned.

[51] Int. Cl.$^5$ .................... H01L 21/00; H01J 7/24
[52] U.S. Cl. .................... 156/345; 156/643; 118/723 I; 204/298.16; 204/298.37
[58] Field of Search ............ 156/345, 643; 118/723; 204/298.16, 298.34, 298.37, 298.38; 315/111.21, 111.41, 111.71, 111.51

[56] References Cited

U.S. PATENT DOCUMENTS

| | | | |
|---|---|---|---|
| 4,362,632 | 12/1982 | Jacob | 156/345 X |
| 4,491,496 | 1/1985 | Laporte et al. | 156/643 X |
| 4,786,352 | 11/1988 | Benzing | 156/345 |
| 4,810,935 | 3/1989 | Boswell | 204/298.37 X |
| 4,826,585 | 5/1989 | Davis | 156/345 X |

FOREIGN PATENT DOCUMENTS 184812 6/1986 European Pat. Off.

*Primary Examiner*—Thi Dang
*Attorney, Agent, or Firm*—Michael J. Balconi-Lamica; Graham S. Jones, II

[57] ABSTRACT

A dry processing apparatus for plasma etching or deposition includes a chamber for plasma processing having an external wall for housing a work piece with a surface to be plasma processed. A source of an induction field is located outside the chamber on its opposite side from the work piece. A radio frequency induction field applied to the chamber generates a plasma. The plasma is confined within the external wall in the chamber by magnetic dipoles providing a surface magnetic field for confining the plasma. The surface magnetic field is confined to the space adjacent to the external wall. An R.F. generator provides an R.F. generated bias to the work piece. The chamber is lined with a material inert to a plasma or noncontaminating to the work piece, and the induction source in the form of a spiral or involute shaped induction coil is located on the exterior of the liner material on the opposite side of the chamber from the work piece. Distribution of gas to the chamber is uniform because a manifold located about the periphery of the chamber and an orifice formed by the surface of the chamber and the manifold admits gas from the manifold into the chamber at a uniform pressure about the periphery of the cover of the chamber.

25 Claims, 4 Drawing Sheets

RADIO FREQUENCY INDUCTION/MULTIPOLE PLASMA PROCESSING TOOL

This is a continuation of application Ser. No. 07/565,851, filed on Aug. 10, 1990, now abandoned.

BACKGROUND OF THE INVENTION

1. Field of the Invention

This invention relates to apparatus for plasma processing of substrates, and more particularly to subtractive (etching) and additive (deposition) processing of electronic circuit chips and packaging materials.

2. Technical Problem

The problem with capacitive coupling of R.F. energy to a plasma employed for etching or depositing films is that to increase power to the level required to generate the plasma required, the voltage will be so high that the charged particles in the plasma will be accelerated to an excessive level of kinetic energy and will tend to sputter the work piece and to etch or sputter away any masks. The effect will be to chamfer the mask opening, i.e. increase the size of openings in masks by etching the edges of the masks. The effect also leads to ion damage and loss of selectivity. This is unacceptable as the requirements in the art are to decrease the size of openings as dimensions are decreasing in microelectronics. Instead one would like the flexibility of varying the ion energy according to the desired process.

2. Related Art

U.S. Pat. No. 3,705,091 of Jacob for "Gas Discharge Apparatus" shows a cylindrical glass reaction chamber coaxially wound with a helical R.F. coil energized by high frequency (13.5 MHz) R.F. to generate a plasma in a vacuum for etching of a tray of semiconductor slices The system operates in the 1 Torr pressure range and produces mainly reactive radicals. The Jacob system does not operate in the desired reactive ion etching, RIE mode of this invention. In the pressure range desired for the present invention of 1 to 50 mTorr, the Jacob system would produce very non-uniform and very slow etching No means for confining the plasma is shown M. C. Vella, K. W. Ehlers, D. Kippenhan, P. A. Pincosy, and R. V. Pyle "Development of R.F. Plasma Generators for Neutral Beams", J. Vac. Sci. Technol. A 3(3), (May/Jun 1985) pp 1218-1221 describes an R.F. plasma source used to generate a high power neutral beam to heat a large fusion plasma to reaction temperatures. The pressure is from 1 to 20 mTorr. A plurality of magnetic dipoles surround the rf bucket chamber to create a magnetic shield for the plasma There is no reference to additive or subtractive treatment of a substrate. Vella et al teaches the use of R.F. induction for plasma production, but it does not teach the use of R.F. induction for etching or deposition where the plasma will etch the coating on an R F. coil and coat the insulators.

R. Limpaecher and K. R. MacKenzie, "Magnetic Multipole Containment of Large Uniform Collisionless Quiescent Plasmas", Rev. Sci. Instrum., Vol 44, No. 6, (June 1973) 726-731 discusses the use of magnetic multipoles for confinement of a plasma of argon at a pressure of 0.002 Torr. This reference is one of the original papers on multipole confinement of the primary electrons in plasma production from electron emission from a hot filament.

U.S. Pat. No. No 4,483,737 of Mantei, "Method and Apparatus for Plasma Etching a Substrate" uses an electrically heated filament to emit electrons, but states at Col. 5, lines 53-65, that a hollow cathode or ion cyclotron resonance can be used to generate electrons. Later, it states that R.F. power sources are not used for the discharge current or for generation of the surface magnetic field confining the plasma. At Col. 6, lines 52-58, it states "The plasma is produced by impact from fast ionizing electrons drawn from a set of heated tungsten filaments, rather than by an applied rf voltage".

See also T. D. Mantei and T. Wicker, "Plasma Etching with Surface Magnetic Field Confinement" Appl. Phys. Lett. 43(1), (1 Jul. 1983) pp. 84-86, and T. D. Mantei and T. Wicker, "Low Pressure Plasma Etching with Magnetic Confinement", Solid State Technology (April 1985) pp. 263-265.

I. Lin, D. C. Hinson, W. H. Class, R. L. Sandstrom, "Low-Energy High Flux Reactive Ion Etching by R.F. Magnetron Plasma", Appl Phys. Lett. Vol. 44 (Jan. 15 1984) pp. 185-187 describes magnetic confinement of a plasma and R.F. power being used for plasma production. The R.F. power is capacitively coupled to a copper prism used as an electrode. This is one of many magnetron reactive ion etching systems. Most of them involve an effort to achieve uniformity from a system in which the electron density increases in the direction of $E \times B$ drift of secondary electrons from the cathode. These systems also provide limited adjustability of the energy of the ions striking a wafer.

U.S. Pat. No. No. 4,632,719 of Chow et al for "Semiconductor Etching Apparatus with Magnetic Array and Vertical Shield" describes etching a semiconductor wafer in an R.F. field in argon gas A pair of rings of concentric dipoles above the wafer create a pair of rings in the plasma above the wafer. This leads to the kind of lack of uniformity of the plasma which would be avoided in systems required to provide uniform etching or deposition. Thus the Chow et al patent would lead one in the opposite direction from the purpose to which this invention is directed.

U.S. Pat. No. 4,384,938 "Reactive Ion Etching Chamber" of B. Desilets et al describes a reactive ion etching tool having a cylindrical reactive ion etching chamber acting as an anode and a plate arrangement acting as a cathode and wherein an R.F. signal applied between cathode and anode acts to produce an active glow region within the chamber with a dark space existing over the internal surfaces thereof. A reactive ion etching chamber structure has an internal top surface and sidewall surfaces forming a physically symmetrical arrangement with respect to the cathode plate positioned between the sidewall surfaces below the top surface, the top surface and surfaces being uniform except for gas input and exhaust ports with the gas exhaust ports having an opening dimension less than the thickness of the dark space existing over the internal surface.

See also Keller et al U.S. Pat. No. 4,383,177 for "Multipole Implantation Isotope Separation Ion Beam Source".

Objects of this invention are:
a) a uniform plasma,
b) plasma density which does not saturate with power,
c) control of ion energy,
d) high etch rates for a given power level, and
e) relative simplicity.

In accordance with this invention, dry processing apparatus for plasma etching or deposition includes a chamber for plasma processing having an external wall for housing a work piece with a surface to be plasma processed in a gas. A source of an induction field is located outside the chamber on its opposite side from the work piece. A radio frequency (R.F.) induction field applied to the chamber generates a plasma in the gas. The plasma is confined within the external wall in the chamber by magnetic dipoles providing a surface magnetic field for confining the plasma. The surface magnetic field is confined to the space adjacent to the external wall. An R.F generator provides an R.F. generated bias to the work piece. The chamber is lined with a material inert to a plasma or noncontaminating to the work piece, and the induction source in the form of a planar involute or spiral induction coil is located on the exterior of the liner material on the opposite side of the chamber from the work piece. Delivery of and distribution of the gas to the chamber is uniform about the periphery of the top cover because a manifold is located about the periphery of the chamber. An orifice for controlling the gas pressure of the gas being admitted to the chamber is formed by the surface of the chamber and the manifold admits gas from the manifold into the chamber at a uniform pressure about the periphery of the cover of the chamber Preferably a surface magnetic field is positioned adjacent to the induction coil to confine the field at the top of the chamber It is further preferred that a capacitive or inductive reactance be connected in series with the induction coil to adjust the R.F. generated bias.

DESCRIPTION OF THE PREFERRED EMBODIMENT

Figure 1:
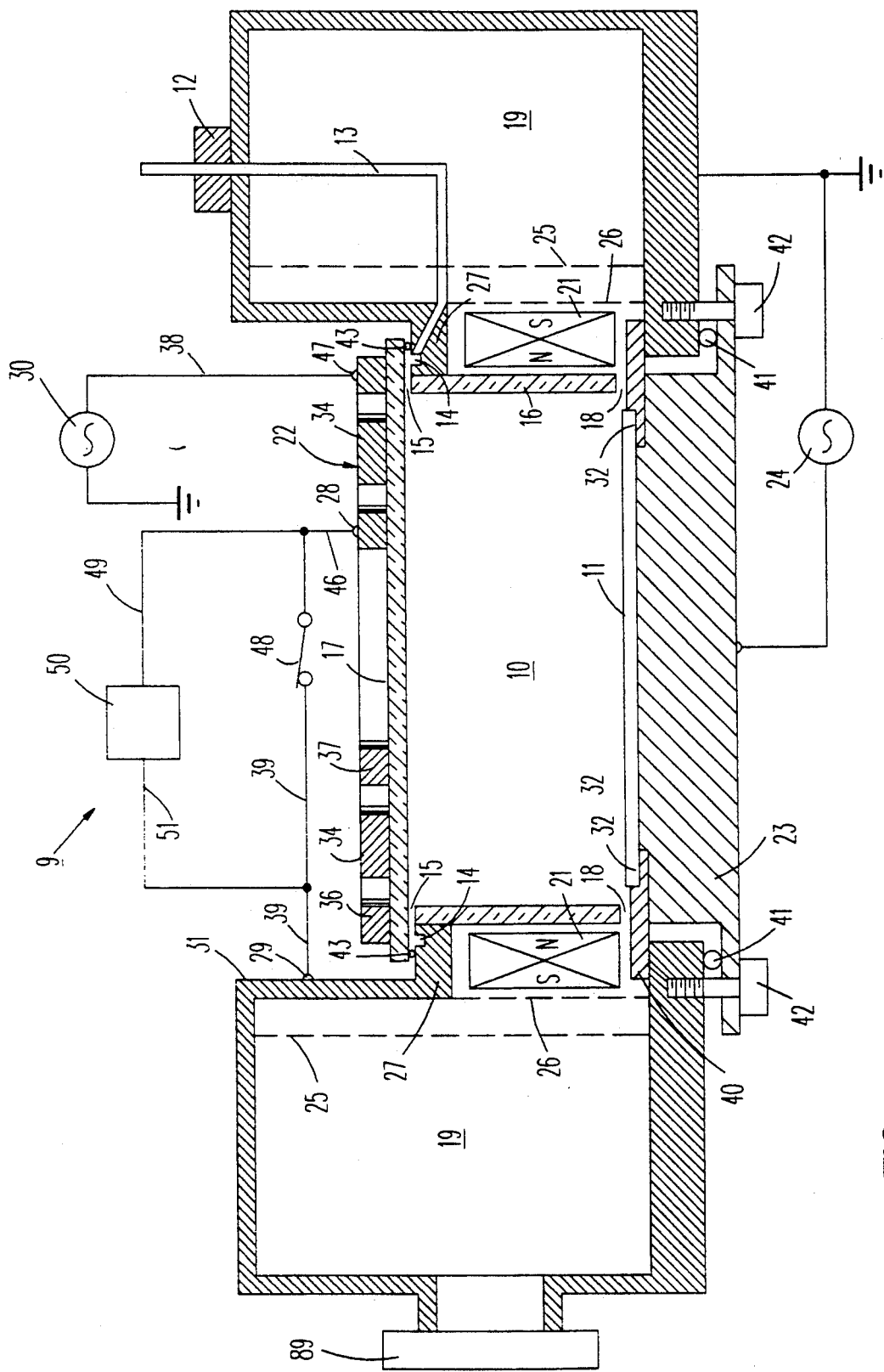
FIG. 1 shows a sectional view of a plasma treatment system in accordance with this invention.

FIG. 1 shows apparatus 9 which includes an evacuated chamber 10 containing a semiconductor wafer 11 that comprises a work piece to be treated with a plasma process. A gas is admitted to chamber 10 from annular manifold 14 via annular orifice 15. The gas is used to form a plasma for processing of wafer 11 by etching or deposition. A liner 16 forming a cylindrical outer wall contains the gas which is to be energized to form a plasma.

Preferably, liner 16 is composed of quartz or another material which is nearly, i.e. substantially, inert or noncontaminating to the plasma to be contained in plasma processing chamber 10. The cover 17 of the chamber 10 is composed of quartz also. Thus the chamber 10 is surrounded by quartz lined liner 16 and cover 17 on the sides and the top with the wafer 11 on the bottom. The wafer 11 is supported on metallic base 23, but is insulated therefrom by an insulating coating on the upper surface of base 23. A flat insulating ring 40 is provided on top of base 23 at the periphery of the wafer 11 and with an indentation 32 for supporting the edges of wafer 11. Ring 40 separates the plasma from the surfaces below, and it is shown shaped with indentation 32 to retain the wafer 11 in a central position at the base of chamber 10.

The gas is admitted to the chamber 10 from gas input port 12 through line 13 to annular manifold 14 formed by annular base 27 and the cover 17. The manifold 14 is about 0.275 inches deep. The manifold 14 is connected to chamber 10 through a circumferential, narrow annular orifice 15 of about 0.005 inches which maintains sufficient pressure of the gas in manifold 14 that the gas is distributed at a relatively uniform pressure about the entire circumference of the top of chamber 10. The gas in manifold 14 passes through orifice 15 between the top of the lip of annular base 27 and the lower surface of cover 17 in substantially equal quantities per unit time all about the circumferential area, i.e. the periphery, at the top of chamber 10 so that the plasma will be more highly uniform within the chamber 10. Preferably, the pressure of the gas in chamber 10 is at a low pressure of about 1-5 mTorr. The gas to be exhausted from chamber 10 passes through annular orifice 18 at the base of the liner 16 or between magnets 21 into exhaust vacuum pumping manifold 19 and out through port 89, which is connected to vacuum pumps (not shown for convenience of illustration.)

Figure 2:
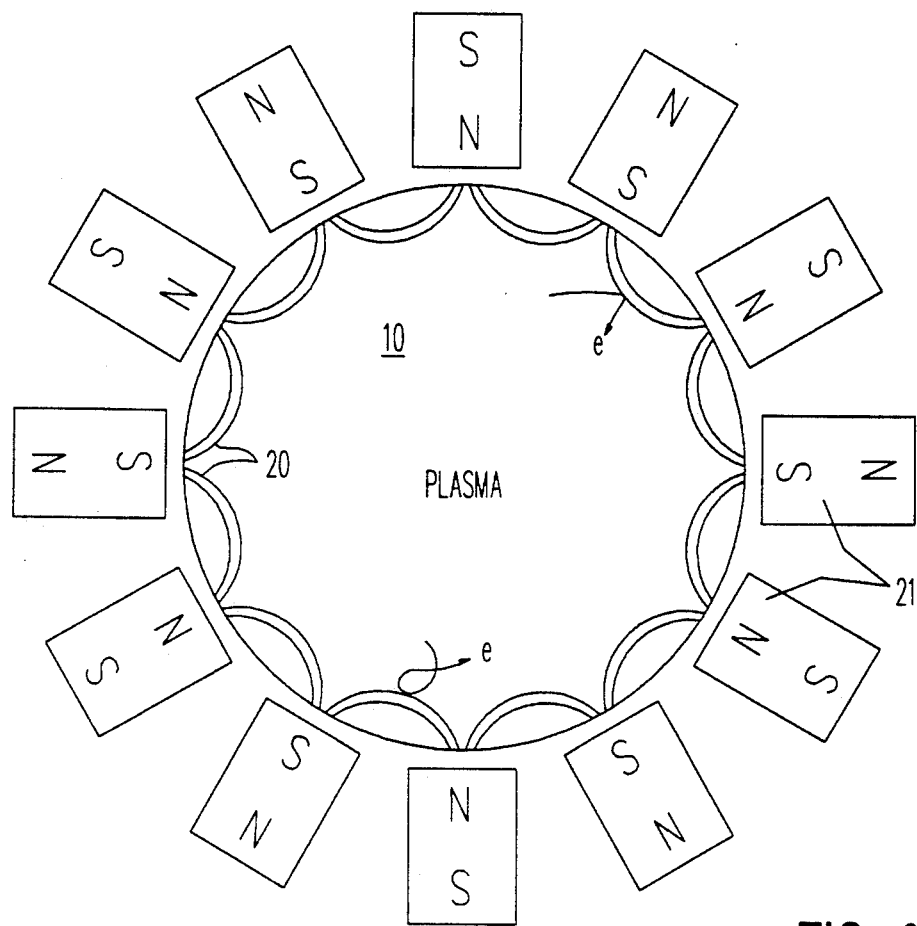
FIG. 2 shows a magnetic multipole arrangement for confinement of a plasma in accordance with this invention.
Figure 3:
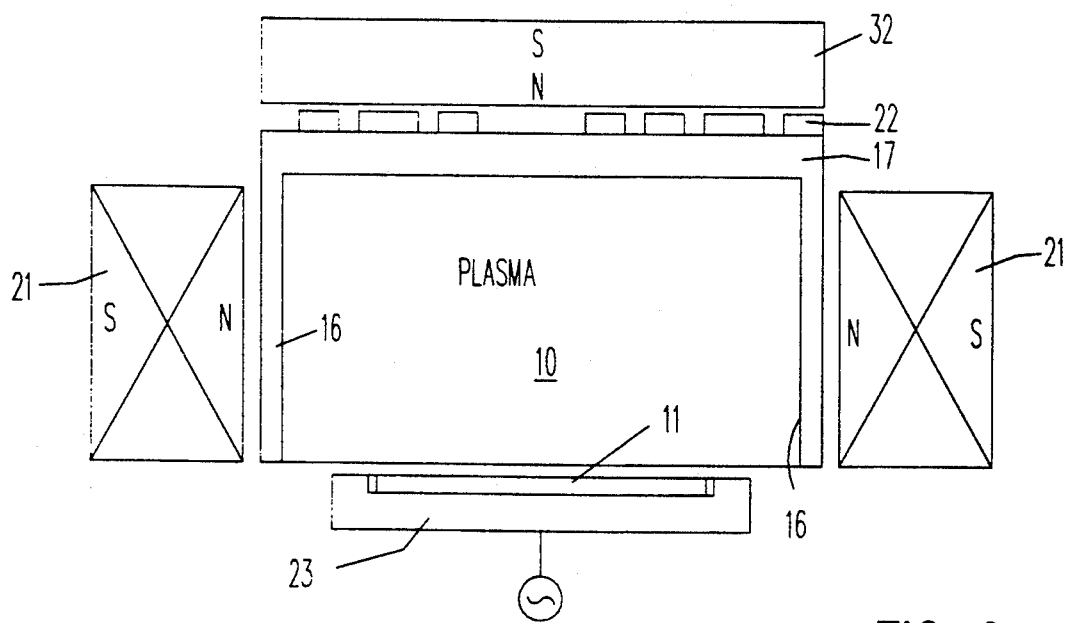
FIG. 3 shows a schematic diagram of some elements of the plasma system of FIG. 1.
Figure 4:
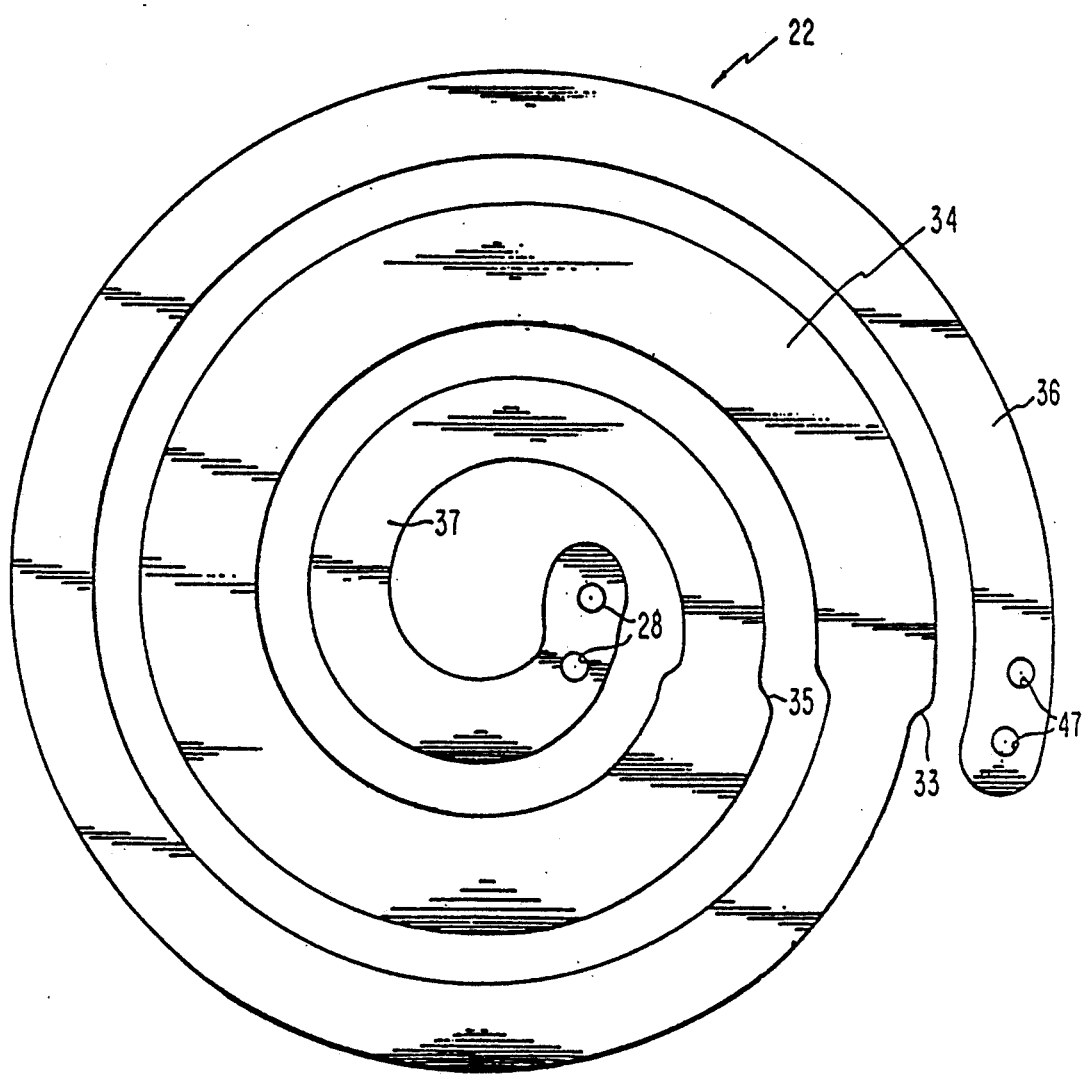
FIG. 4 shows a plan view of the planar involute or spiral shaped R.F. induction field coil in the system of FIG. 1 in accordance with this invention.

Apparatus to provide magnetic confinement of the plasma is employed in the form of multiple-magnetic-dipoles (multipoles) 21 with vertical axes as shown in FIGS. 1, 2 and 3. The multipoles 21 have their fields the cylindrical chamber 10. Multipoles 21 are arranged about the periphery of liner 16 in the classic magnetic confinement cylindrical arrangement. The multipoles have their magnetic field directed inwardly as indicated by the plan view in FIG. 2. With this arrangement the alternating of the north and south poles (of multipoles 21) directed inwardly, looking down as in FIG. 2, provide a wall of magnetic field forces which repel electrons back into the interior of chamber 10, thereby reducing the number of activated ions striking the walls and varying the uniformity of concentration of the plasma near the wafer 11. As can be seen in FIG. 2, the magnetic field contains cusps 20 pointing towards the multipoles 21. It will be obvious to those skilled in the art that magnets 21 can provide cylindrical cusps instead of line cusps. A planar radio frequency induction (R.F I.) coil 22 is wound in a spiral or involute form on top of quartz cover 17 of chamber 10 as shown in FIG. 4. The coil 22 is energized by a 13 MHz radio frequency source 30 with a power of about 300 watts per amp of ions of the gas. Source 30 is connected by line 38 to the outer end of coil 22 at terminal 47. The other end of source 30 is also connected to ground completing the circuit. The inner end of spiral coil 22 is connected at terminal 28 by line 46 through switch 48 and line 39 to a bond 29 on the grounded wall 31 of apparatus 9 which is at electrical ground.

Referring to FIG. 3, for higher density plasmas, magnetic multipole confinement by magnets 32 located above cover 17 on its surface can be added adjacent to coil 22 to reduce the plasma loss to cover 17.

Switch 48 shorts out lines 49 and 51 which connect a reactance 50 in series with R.F. coil 22 Reactance 50 can be a variable or fixed reactance which is capacitive or inductive, as desired, to adjust the R F. bias on the plasma The connection of reactance 50 in series with coil 22, between terminal 28 and ground connection 29, is employed for the case where one is using the R.F. coil 22 alone, i.e. not using R.F. bias from source 24. Reactance 50 is useful in a case in which it is desired to use R.F. induction without the R.F. bias from source 24. In this case one can vary the ion energy over a somewhat smaller range 10 eV to 80 eV. In accordance with this aspect of the invention one varies the impedance to ground (from the center of the coil 22, bypassing line 39 when switch 48 is opened to close the circuit to ground through reactance 50 and lines 49, 51 and 39 as well as bond 29.) This allows one to go from the smallest amount of capacitive coupling (equivalent to middle turn 34 being at R.F. ground potential) with a value of capacitive impedance equal to one half of the coils inductive impedance to somewhat more capacitive coupling for reactance 50 being inductive.

Referring to FIG. 4, planar coil 22 includes a spiral with terminals, tapped holes comprising terminals 28 and 47 respectively for joining lines 28 and 38 to coil 22. Coil 22 is shown having three turns with the second (middle) turn 34 from transition 33 to transition 35 being substantially wider to enhance the inductive qualities of the coil 22. Both the outer turn 36 and the inner turn 37 are of about the same width. The advantage of this design is that the plasma is more uniform beneath the second (middle) turn 34 than it would be with a coil with a single width. In general this principle applies regardless of how many turns are involved. What is involved with the variation in width (i.e. cross-sectional area) is that the inductances of the three turns are rebalanced.

The R.F. energy from the coil 22 ionizes the gas in chamber 10 into a sustained plasma for additive or subtractive processing of the wafer 11. The wafer 11 is supported on metallic base 23. Metallic base 23 cools wafer 11 with electrostatic clamping and backside cooling not shown for convenience of illustration, but as is well understood by those skilled in the art. Base 23 is connected to an R.F. biasing source 24 at a frequency above about 13 MHz, preferably at 40 MHz which sets up an R.F. bias between the wafer 11 and the plasma, leading to a D.C. bias on the wafer 11. The use of different frequencies reduces coupling between the two power supplies. The high frequency R.F. bias gives a more monotonic distribution of ion energy, so there is improved control of ion energy for better selectivity of the rate of etching.

This R.F. bias provides ion energy control of the ions from the plasma as the R.F. level of the base 23 is varied by R.F. source 24 A dark space exists upon the upper surface of the wafer 11. The use of R.F. coil 22 instead of a capacitively coupled R.F. electrode to generate the plasma affords the advantage of reducing and controlling the kinetic energy of the ions striking the walls of liner 16 and wafer 11, thereby reducing the damage that can be done by ions and electrons at the high energy levels required for plasma processing contemplated for use with this apparatus. This also gives the flexibility of adjusting the ion energy according to process needs.

In the exhaust manifold or chamber 19 are located cylindrical walls of vertical screening 25 which extends from top to bottom in chamber 19 and a shorter wall of screening 26 which extends from the bottom of annular base 27 to the bottom of chamber 19. Screening 25 and 26 are included to provide grounded surfaces which will prevent the plasma from extending far into the manifold 19. Nylon bolts 42 secure base 23 to apparatus 9 with the O-ring gasket 41 sealing the chamber 10 from the atmosphere.

Gases suitable for use in forming the plasma are well known and some of them are listed as exemplary gases.

$CCl_2F_2 + 20\% SF_6$ $C_3F_8 + 16\% SF_6$ $C_3F_8$ $CF_4$ $O_2$ $Ar^*10\%O_2$

Figure 5:
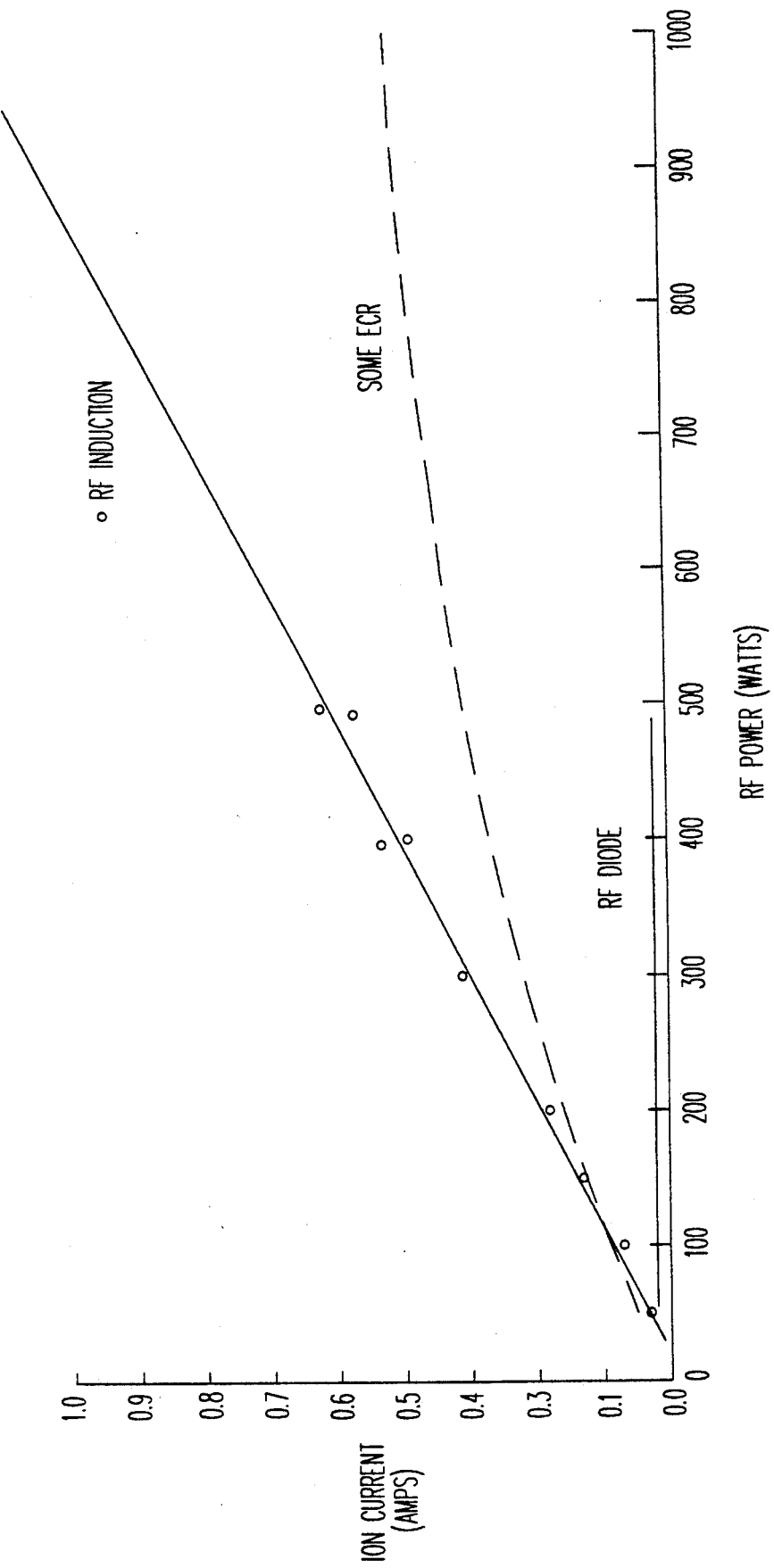
FIG. 5 is a graph of ion current vs R.F. power for three plasma processing systems.

FIG. 5 is a graph of ion current vs R.F. power for three plasma processing systems. One curve is for R.F. power supplied to induction coil 22 employed in the instant embodiment, which produces a linear curve. As is well known to those skilled in the art, the dotted curve in FIG. 5 is for a system in which the plasma is generated by a particular electron cyclotron resonance (ECR) device. The other dotted curve is for a system in which the plasma is formed by an R.F. diode, i.e. capacitively coupled R.F. It can be seen that at higher power levels, the R.F. induction produces far higher ion current at a given power level plus a linear rate of increase which are both preferred characteristics. Ion current does not saturate as power increases, so very high plasma densities can be achieved at low ion kinetic energies.

Industrial Applicability

This system and method is useful for both plasma etching and plasma coating processes, particularly in fields such as large scale integrated semiconductor devices and packages therefor. Other fields requiring microfabrication will also find use for this invention.

In plasma annealing of gate oxides or oxide isolation, one should avoid any peak-to-peak voltages above the "K alpha" energies of carbon, nitrogen and oxygen which are about 283, 401 and 532 respectively. Concomitantly, one desires a high density of atomic and ion hydrogen. This is very difficult to achieve employing capacitively coupled R.F., even in the magnetron modes. We have found that it is easily achieved when employing an R.F. inductively coupled plasma.

This system can replace wet HF solutions for etching of thin layers.

What is claimed is:

1. A plasma dry processing apparatus comprising
   a) a chamber for plasma processing having an external wall, said chamber containing at least one work piece having a surface to be processed in a plasma,
   b) induction means for providing a radio frequency induction field within said chamber for generating a plasma within said chamber, said induction means comprising a planar induction coil located at an end of said chamber spaced from said work piece, and
   c) confining means for providing a surface magnetic field for confining said plasma within said chamber,
      i) said confining means comprising multiple magnetic dipoles with their fields directed inwardly towards the interior of said chamber with alternating north and south poles in a magnetic confinement cylindrical pattern with their fields directed at right angles towards the vertical axis of said chamber, and ii) said surface magnetic field being substantially confined to the space adjacent to said external wall with said surface magnetic field extending from the exterior of said chamber to provide magnetic field cusps proximate to the periphery of the interior of said external wall, whereby said induction coil generates a plasma in said chamber and electrons are repelled to the interior of said chamber from motion towards the walls thereof to produce greater uniformity of said plasma near said work piece.

2. Apparatus in accordance with claim 1 wherein said induction means is located on the exterior of said chamber.

3. Apparatus in accordance with claim 2 wherein said work piece is located at the opposite end of said chamber from said induction means.

4. Apparatus in accordance with claim 2 including means for providing a surface magnetic field positioned adjacent to said induction means.

5. Apparatus in accordance with claim 1 including radio frequency energization means for providing a R.F. generated bias to said work piece.

6. Apparatus in accordance with claim 1 wherein said chamber is lined with a liner material substantially inert to a plasma or substantially noncontaminating to said work piece and said induction means is located on the exterior of said liner material with said work piece being on the opposite end of said chamber from said induction means.

7. Apparatus in accordance with claim 1 wherein means are provided for uniformly admitting a gas to said chamber comprising a) manifold means located about the periphery of said chamber at the opposite end of said chamber from said work piece, and b) orifice means located between the surface of said chamber and said manifold means for admitting said gas from said manifold into said chamber, whereby said gas is admitted to said chamber from said manifold with a substantially uniform pressure so that said plasma will be uniform within said chamber.

8. Apparatus in accordance with claim 1 including reactance means connected in series with said induction means, whereby one can produce and adjust a radio frequency generated bias.

9. Apparatus in accordance with claim 1 wherein said coil comprises an involute spiral coil, said coil including a larger cross section between the end windings thereof, whereby more uniform plasma is produced adjacent to said larger cross section windings than with a winding of uniform cross section.

10. A plasma dry processing apparatus comprising a) a chamber for plasma processing, at least one work piece having a surface to be processed in a plasma, b) means comprising an involute, planar, spiral, induction coil at the other end of said chamber for providing a radio frequency induced magnetic field to generate a plasma within said chamber, and c) confining means for providing a distributed magnetic confinement field about the periphery of said chamber, whereby electrons are repelled to the interior of said chamber from motion towards the walls thereof to produce greater uniformity of the plasma near said work piece.

11. Apparatus in accordance with claim 10 wherein said induction means is located on the exterior of said chamber.

12. Apparatus in accordance with claim 11 wherein said work piece is located on the opposite end of said chamber from said induction means.

13. Apparatus in accordance with claim 11 including means for providing a surface magnetic field positioned adjacent to said induction means.

14. Apparatus in accordance with claim 10 including radio frequency energization means for providing a R.F. generated bias to said work piece.

15. Apparatus in accordance with claim 10 wherein said chamber is lined with a liner material substantially inert to said plasma or substantially noncontaminating to said work piece, and said induction means is located on the exterior of said liner material with said work piece being on the opposite end of said chamber from said induction means, whereby said gas is admitted to said chamber from said manifold with a substantially uniform pressure, so that said plasma will be uniform within said chamber.

16. Apparatus in accordance with claim 10 wherein means are provided for uniformly admitting a gas to said chamber comprising a) manifold means located about the periphery of said chamber, and b) orifice means located between the surface of said chamber and said manifold means for admitting said gas from said manifold into said chamber, whereby said gas is admitted to said chamber from said manifold with a substantially uniform pressure so that said plasma will be uniform within the chamber.

17. Apparatus in accordance with claim 10 including reactance means connected in series with said induction means, whereby one can produce and adjust a radio frequency generated bias.

18. Apparatus in accordance with claim 10 wherein said involute spiral coil includes a larger cross section between the end windings thereof, whereby more uniform plasma is produced adjacent to said larger cross section windings than with a winding of uniform cross section.

19. A reactive ion etching system comprising a) a cylindrical etching chamber formed by an electrode structure, a chamber top and chamber sidewalls, b) an R.F. electrically, biased structure for supporting the workpieces to be processed, and c) induction means for applying an R.F. induction field to produce in the active plasma etching portion of the chamber a glow region which is separated from the internal chamber surfaces by means for providing a distributed magnetic confinement field about the periphery of said chamber, and d) said induction means comprising a spiral, planar, induction coil disposed at the other end of said chamber from said workpieces for providing a radio frequency induced magnetic field to generate a plasma within said chamber.

20. Apparatus in accordance with claim 19 including reactance means connected in series with said induction means, whereby one can adjust said R.F. generated bias.

21. Apparatus in accordance with claim 19 wherein said chamber is lined with a liner material substantially inert to a plasma or substantially noncontaminating to said work piece and said induction means is located on the exterior of said liner material on the opposite end of said chamber from said work piece.

22. Apparatus in accordance with claim 19 wherein said involute spiral coil includes a larger cross section between the end windings thereof,
   whereby more uniform plasma is produced adjacent to said larger cross section windings than with a winding of uniform cross section.

23. A plasma dry processing apparatus comprising
   a) a chamber for plasma processing having an external wall, a base and a cover, said chamber containing within said wall at least one work piece having a surface to be processed in a plasma, said work piece being located on said base in said chamber,
   b) induction means for providing a radio frequency induction field within said chamber for generating a plasma within said chamber, said induction means comprising a planar involute spiral coil juxtaposed with said cover at the other end of said chamber from said work piece, and
   c) confining means for providing a surface magnetic field for confining said plasma within said chamber, said confining means comprising multiple magnetic dipoles with their fields directed inwardly towards the interior of said chamber with alternating north and south poles in a magnetic confinement cylindrical arrangement with their fields directed at right angles towards said axis, said surface magnetic field being substantially confined to the space adjacent to said external wall with said surface magnetic field extending from the exterior of said chamber to provide magnetic field cusps proximate to the periphery of the interior of said external wall,
   whereby electrons are repelled to the interior of said chamber so that said plasma will be uniform within said chamber.

24. Apparatus in accordance with claim 23 wherein said involute spiral coil includes a larger cross section between the end windings thereof,
   whereby more uniform plasma is produced adjacent to said larger cross section windings than with a winding of uniform cross section.

25. A plasma dry processing apparatus comprising
   a) a chamber for plasma processing, said chamber having an external wall, said chamber containing at least one work piece having a surface to be processed in a plasma,
   b) means for providing a radio frequency induction field within said chamber for generating a plasma within said chamber,
   c) means for providing a distributed magnetic confinement field about the periphery of said chamber,
   d) said induction means comprising an involute, planar spiral coil, and
   e) said confining means comprising multiple magnetic dipoles with their fields directed inwardly towards the interior of said chamber with alternating north and south poles in a magnetic confinement cylindrical arrangement,
   whereby electrons are repelled to the interior of said chamber.

* * * * *